(12) United States Patent
Hsiung et al.

(10) Patent No.: US 9,449,701 B1
(45) Date of Patent: Sep. 20, 2016

(54) NON-VOLATILE STORAGE SYSTEMS AND METHODS

(71) Applicant: SANDISK TECHNOLOGIES INC., Plano, TX (US)

(72) Inventors: Chia-Lin Hsiung, Fremont, CA (US); Fumiaki Toyama, Cupertino, CA (US); Mohan Dunga, Santa Clara, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/788,366

(22) Filed: Jun. 30, 2015

(51) Int. Cl.
*G11C 16/04* (2006.01)
*G11C 16/26* (2006.01)
*H01L 27/115* (2006.01)

(52) U.S. Cl.
CPC ......... *G11C 16/26* (2013.01); *H01L 27/11519* (2013.01); *H01L 27/11524* (2013.01); *H01L 27/11556* (2013.01)

(58) Field of Classification Search
CPC . G11C 2216/16; G11C 2216/18; G11C 8/12; G11C 16/26; G11C 16/28
USPC ........................................ 365/185.11, 185.2
See application file for complete search history.

(56) References Cited

U.S. PATENT DOCUMENTS

| | | | | |
|---|---|---|---|---|
| 2011/0261626 A1* | 10/2011 | Kim | ..................... | G11C 11/5642 365/185.22 |
| 2014/0347912 A1* | 11/2014 | Siau | ....................... | G11C 7/062 365/148 |

* cited by examiner

*Primary Examiner* — Huan Hoang
(74) *Attorney, Agent, or Firm* — Vierra Magen Marcus LLP

(57) ABSTRACT

A non-volatile storage system is provided. The non-volatile storage system includes a memory array that includes a plurality of bit lines and a plurality of sense blocks, a plurality of bit line select transistors arranged in a bit line select transistor array, each bit line select transistor coupled between a corresponding one of the bit lines and a corresponding one of the sense blocks, the bit line select transistor array including an edge bit line select transistor adjacent an edge of the bit line select transistor array, and a first dummy bit line select transistor adjacent the edge bit line select transistor.

22 Claims, 10 Drawing Sheets

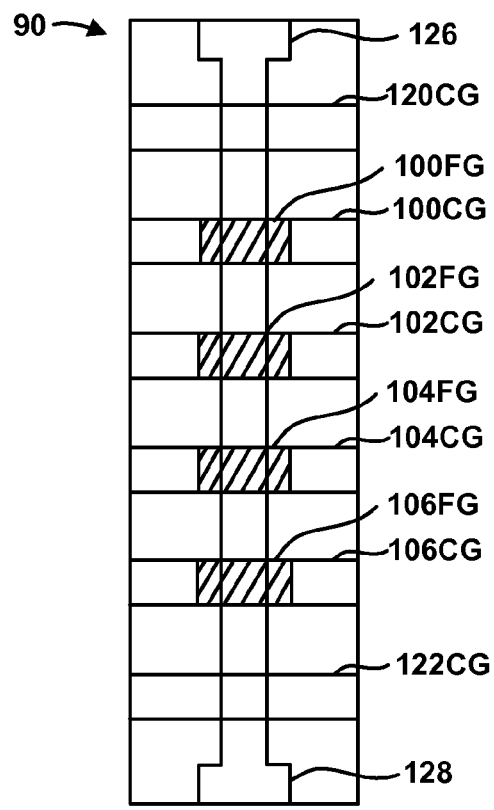
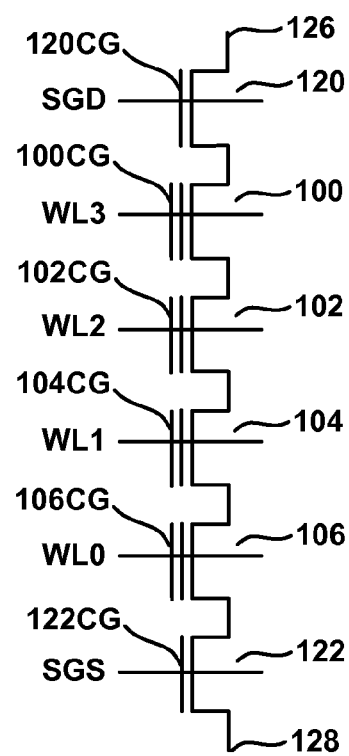
FIG. 1
(PRIOR ART)
FIG. 2
(PRIOR ART)

NON-VOLATILE STORAGE SYSTEMS AND METHODS

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include reduced spacing between transistors and tighter design rule requirements.

BRIEF DESCRIPTION OF THE DRAWINGS

FIG. 1 depicts one embodiment of a NAND string.

FIG. 2 depicts one embodiment of the NAND string of FIG. 1 using a corresponding circuit diagram.

DETAILED DESCRIPTION

Figure 3A:
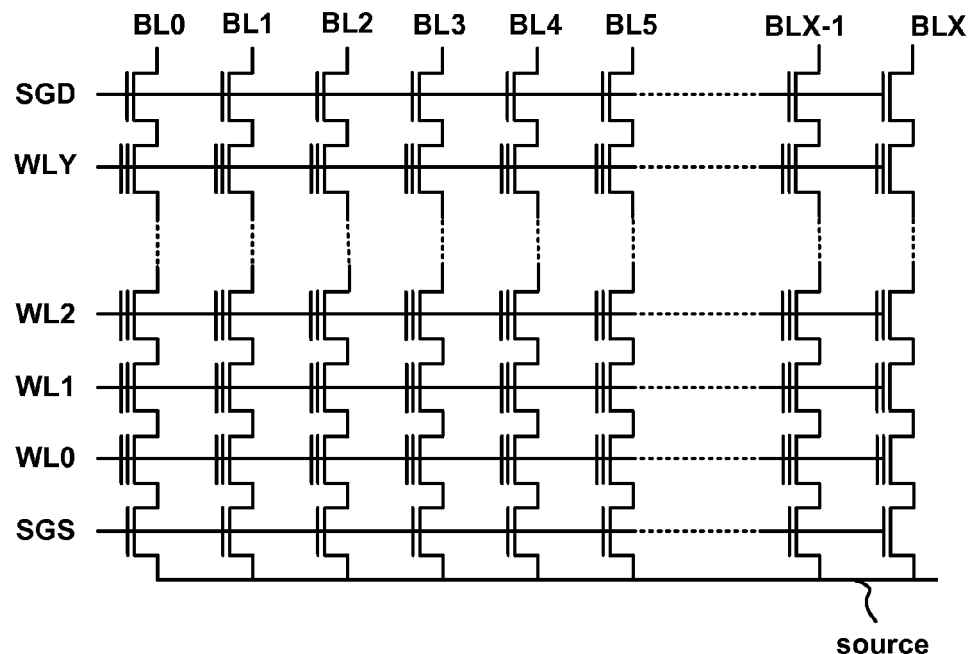
FIG. 3A depicts one embodiment of a memory block including a plurality of NAND strings.

Technology is described for increasing the junction breakdown voltage associated with junctions of bit line select transistors by providing dummy transistors and/or polysilicon shields adjacent the transistor. In one embodiment, the transistor may comprise a high voltage NMOS transistor that may transfer a high voltage to a signal line within an integrated circuit.

The memory array may include a NAND memory array, a 3D NAND memory array (e.g., a bit cost scalable (BiCS) NAND structure), or a three-dimensional memory array (e.g., a 3D ReRAM memory array).

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide)

In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions.

In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the rewriteable non-volatile memory cells may comprise resistive RAM (ReRAM) devices.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects NAND string 90 to a bit line 126. Select gate 122 connects NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2).

Each of transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may be fabricated using the technology described herein.

In some embodiments, to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2.

One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die. Therefore, from an integrated circuit area standpoint, it may be beneficial to only use one drain-side selection gate for each NAND string and then connect each NAND string of the pair with only one of the two drain-side selection signals.

In one embodiment, when programming a memory cell, such as a NAND flash memory cell, a program voltage may be applied to the control gate of the memory cell and the corresponding bit line may be grounded. These programming bias conditions may cause electrons to be injection into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed.

In one embodiment, memory cells may be erased by raising the p-well to an erase voltage Verase for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of cells. In an embodiment, Verase has a maximum value Veramax of 24 V, although other Veramax values may be used.

In some embodiments, during verify operations and/or read operations, a selected word line may be connected (or biased) to a voltage, a level of which is specified for each read and verify operation to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line.

If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
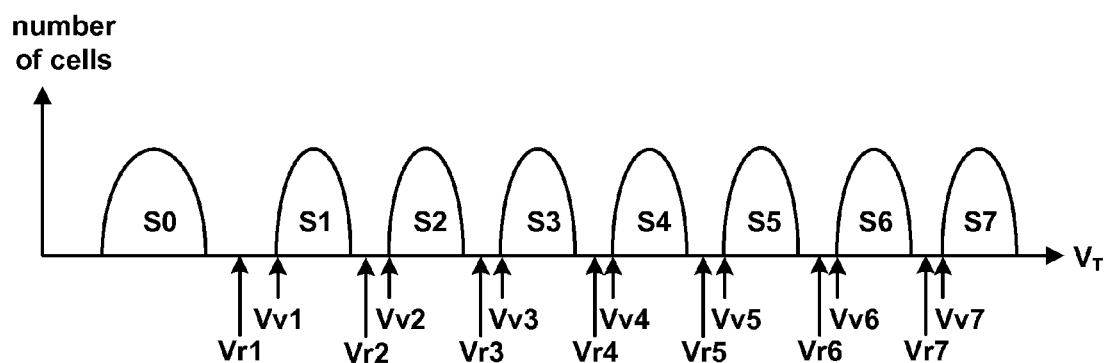
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7).

Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 4:
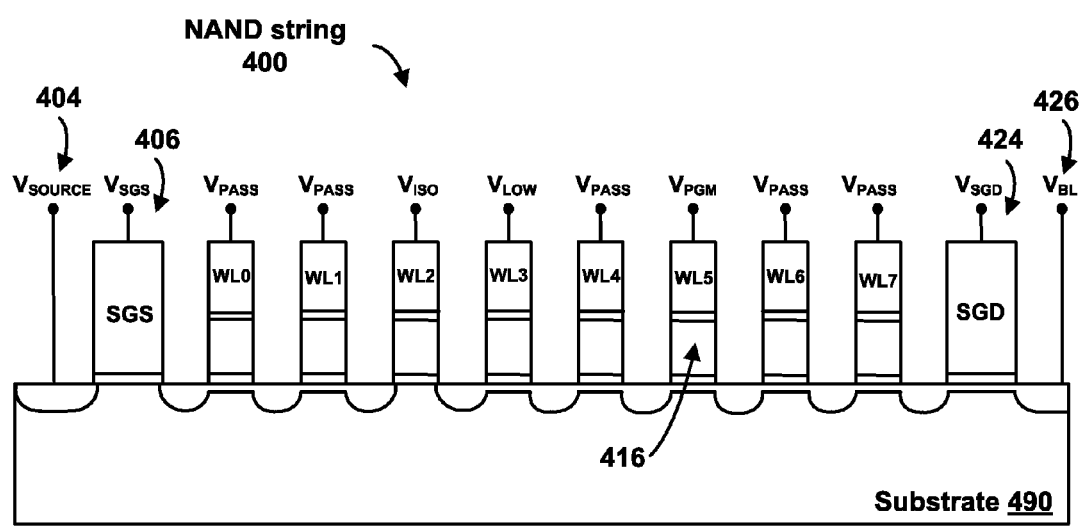
FIG. 4 depicts one embodiment of a NAND string during a programming operation.

FIG. 4 depicts one embodiment of a NAND string 400 during a programming operation. When programming a storage element (e.g., the storage element associated with WL5) of NAND string 400, a program voltage may be applied to a word line associated with the storage element and a low voltage (e.g., ground) may be applied to the bit line associated with the storage element. As depicted, NAND string 400 includes a source-side select gate 406, a drain-side select gate 424, and eight word lines WL0-WL7 formed above a substrate 490. $V_{SGS}$ may be applied to source-side select gate 406 and $V_{SGD}$ may be applied to drain-side select gate 424. The bit line 426 may be biased to $V_{BL}$ and the source line 404 may be biased to $V_{SOURCE}$. During a programming operation, a programming voltage, $V_{PGM}$, may be applied to selected word line WL5, which is associated with a selected storage element 416.

In one example of a boosting mode, when storage element 416 is the selected storage element, a relatively low voltage, $V_{LOW}$, e.g., 2-6 V, may be applied to a neighboring source-side word line (WL3), while an isolation voltage, $V_{ISO}$, e.g., 0-4 V, may be applied to another source-side word line (WL2), referred to as an isolation word line and a pass voltage, $V_{PASS}$, may be applied to the remaining word lines associated with NAND string 400 (in this case word lines WL0, WL1, WL4, WL6, and WL7). Although the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than $V_{PASS}$ which is less than $V_{PGM}$.

Figure 5:
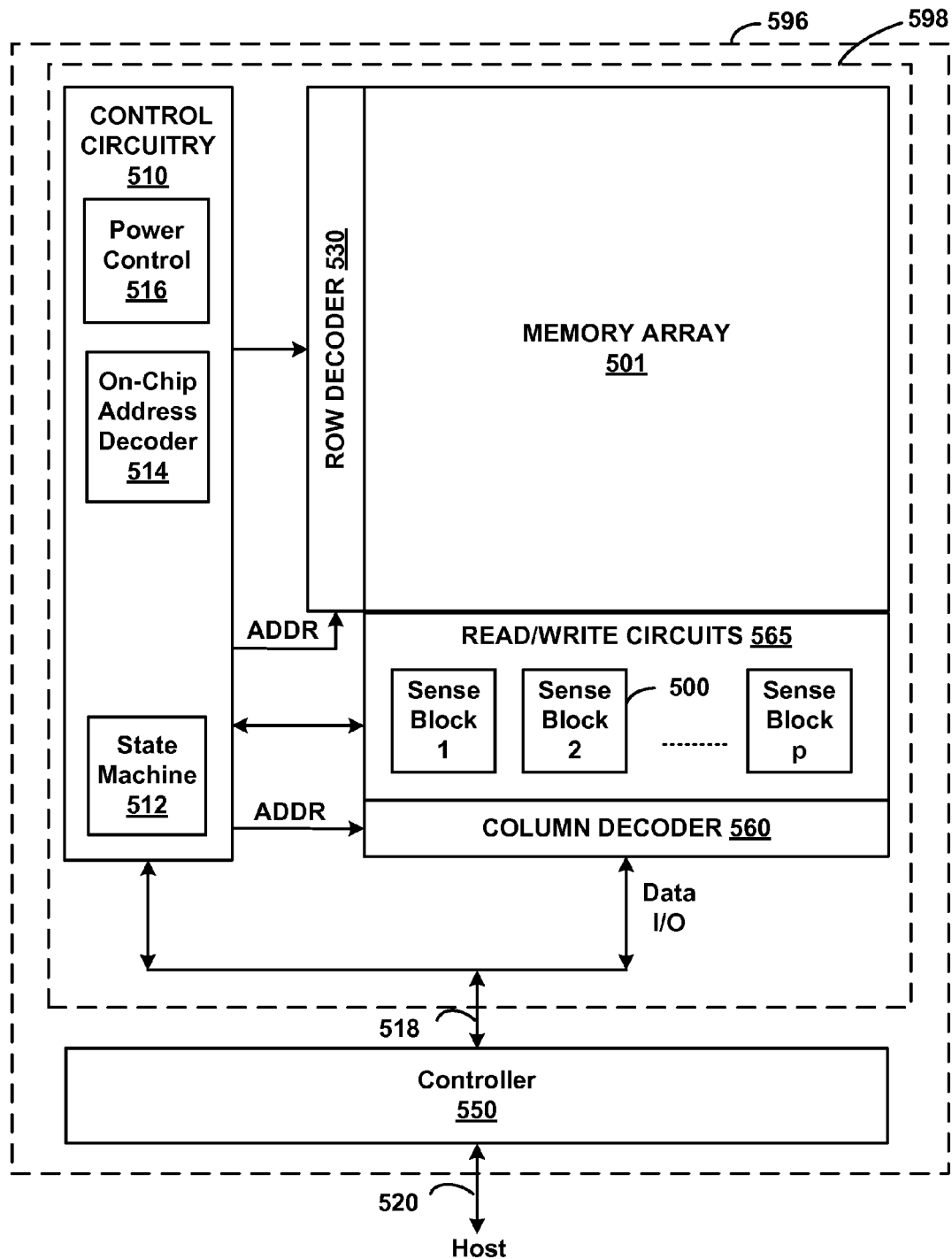
FIG. 5 depicts one embodiment of a non-volatile storage system.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565.

In one embodiment, access to memory array 501 by the various peripheral circuits (e.g., row decoders or column decoders) is implemented in a symmetric fashion, on opposite sides of the array, so that the densities of access lines and circuitry on each side are reduced by half. Memory array 501 is addressable by word lines via a row decoder 530 and by bit lines via a column decoder 560. Word lines and bit lines are examples of memory array control lines.

Read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between controller 550 and memory die 598 via lines 518.

Control circuitry 510 cooperates with read/write circuits 565 to perform memory operations on memory array 501. Control circuitry 510 includes a state machine 512, an on-chip address decoder 514, and a power control module 516. State machine 512 provides chip-level control of memory operations. On-chip address decoder 514 provides an address interface between that used by the host or a memory controller to the hardware address used by the decoders 530 and 560. Power control module 516 controls the power and voltages supplied to the word lines and bit lines during memory operations. In one embodiment, power control module 516 includes one or more charge pumps that can create voltages larger than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits may perform or facilitate one or more memory array operations including erasing, programming, or reading operations.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously.

A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array.

Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
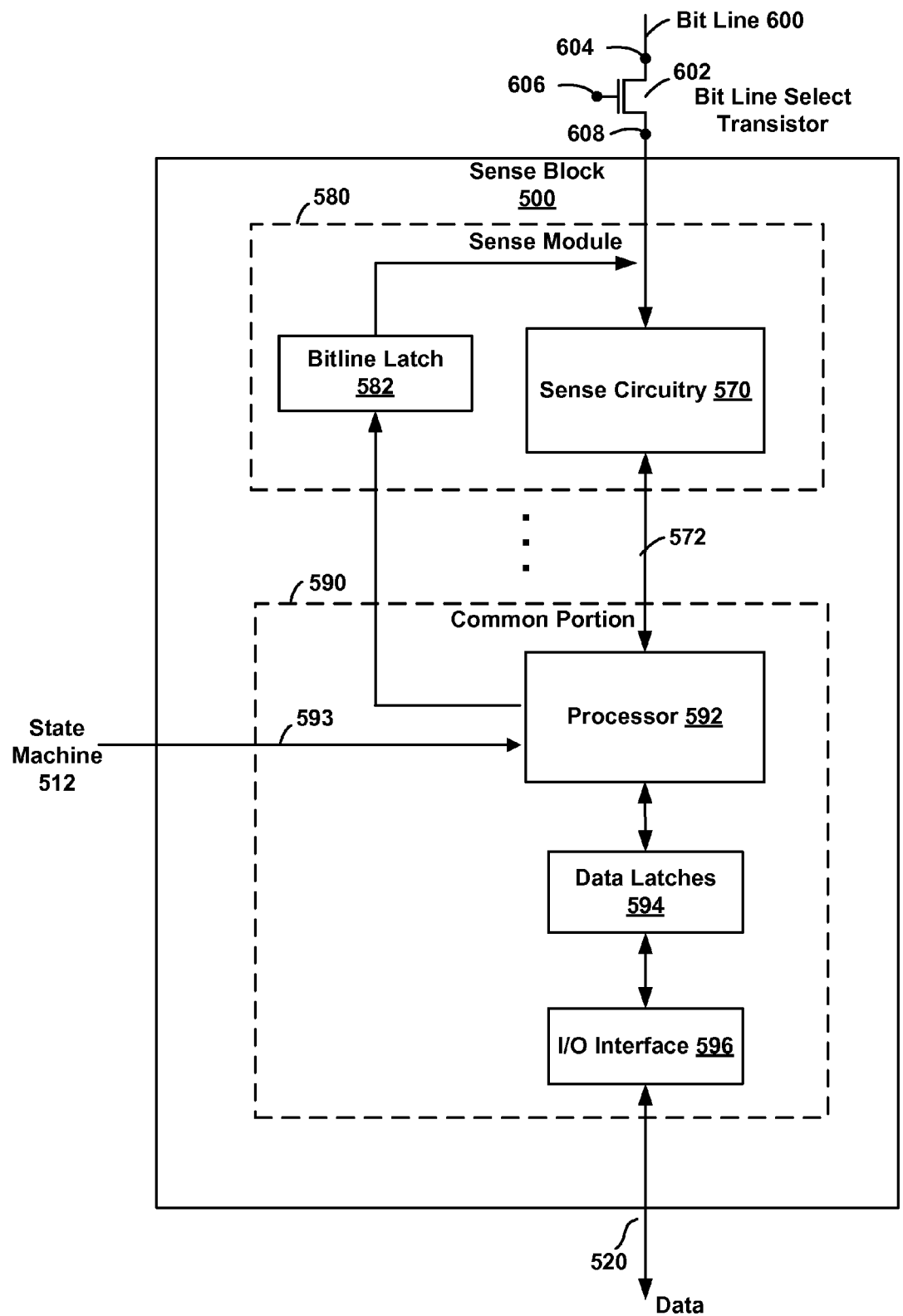
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches.

The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, sense module 580 may trip at one of these voltages and an output will be provided from sense module 580 to processor 592 via bus 572.

At that point, processor 592 determines the resultant memory state by consideration of the tripping event(s) of the sense module and the information about the applied control gate voltage from the state machine via input lines 593.

Processor 592 then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed are stored in the set of data latches 594. The programming operation, under the control of state machine 512, comprises a series of programming voltage pulses applied to the control gates of the addressed storage elements. Each program pulse is followed by a read back (or verify process) to determine if the storage element has been programmed to the desired memory state.

Processor 592 monitors the read back memory state relative to the desired memory state. When the two are in agreement, processor 592 sets the bit line latch 582 to cause the bit line to be pulled to a state designating program inhibit voltage. This inhibits the storage element coupled to the bit line from further programming even if program pulses appear on its control gate. In other embodiments, processor 592 initially loads bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

As described above, in an embodiment, NAND strings within a memory block may share a common well (e.g., a P-well), and memory cells in the memory block may be erased by raising the p-well to erase voltage Verase for a sufficient period of time and grounding the word lines of a selected block of memory cells while the source and bit lines are floating. As a result of capacitive coupling, the floating bit lines will increase to Verase, which may have a maximum value Veramax of 24 V. However, circuitry in sense block 500 typically operates at a much lower voltage (e.g., 4 volts) than Veramax.

To isolate the higher voltage bit lines during erase operations from the lower voltage circuits in sense block 500, each bit line is coupled to a corresponding sense module and bit line latch via a bit line select transistor. For example, as depicted in FIG. 6, bit line 600 is coupled via a bit line select transistor 602 to sense module 580 and bit line latch 582. Bit line select transistor 602 includes a first terminal 604 (e.g., a drain terminal), a second terminal 606 (e.g., a gate terminal), and a third terminal 608 (e.g., a source terminal). During erase operations, bit line select transistor 602 disconnects bit line 600 from sense module 580 and bit line latch 582 based on a control signal coupled to second terminal 606.

Thus during erase operations, the bit line select transistors must be able to sustain Veramax, and in particular, the bit line select transistors must have a junction breakdown voltage greater than Veramax. One technique for increasing transistor junction breakdown voltage is to increase transistor width. However, because of limited available space and design rule constraints, this technique may not provide a sufficiently large increase in breakdown voltage to sustain Veramax. Another technique for increasing transistor junction breakdown voltage is to modify the fabrication process parameters. However, making such process adjustments may negatively affect other transistor parameters throughout the memory device.

Figure 7A:
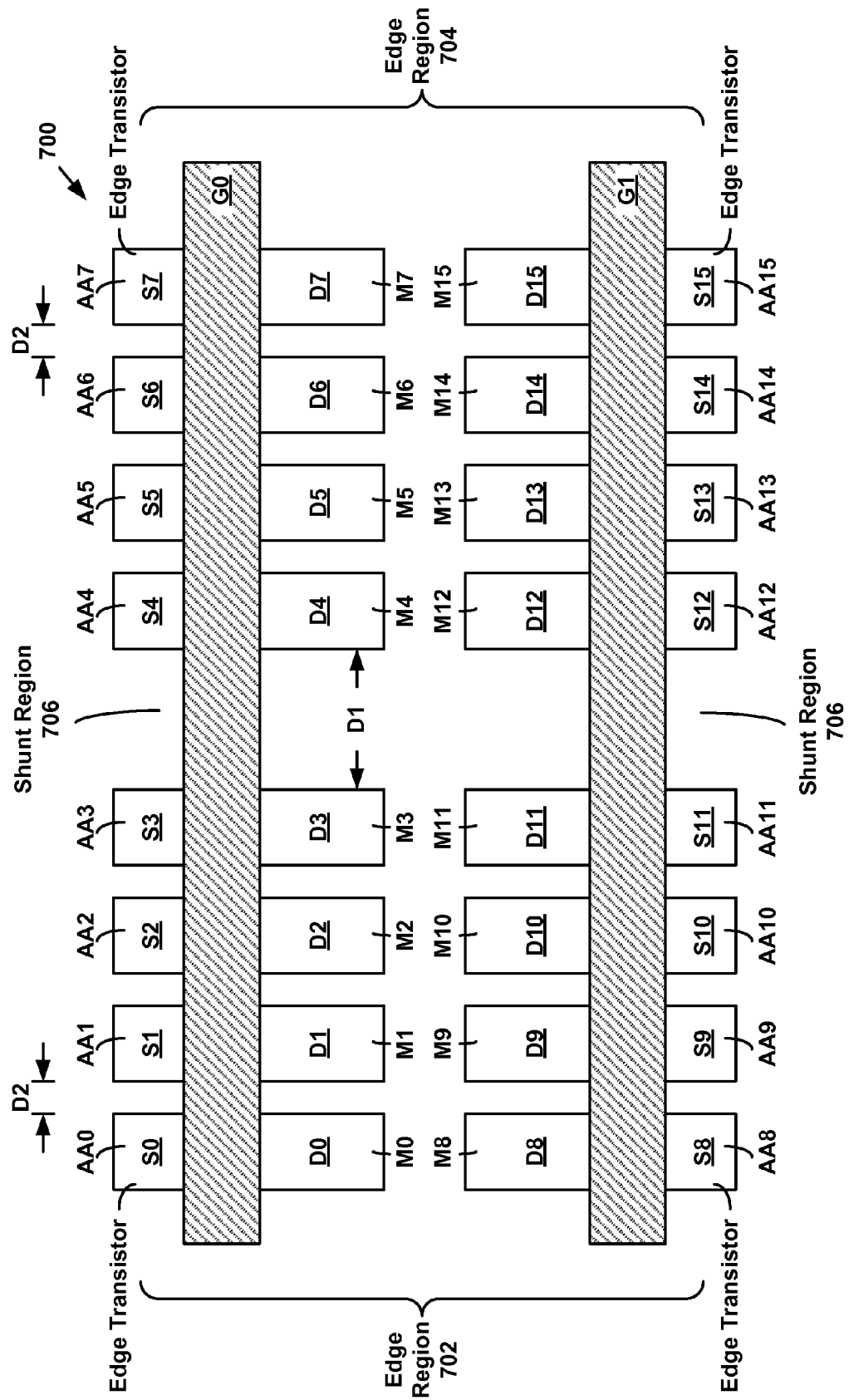
FIG. 7A depicts one embodiment of an array of bit line select transistors.
Figure 7B:
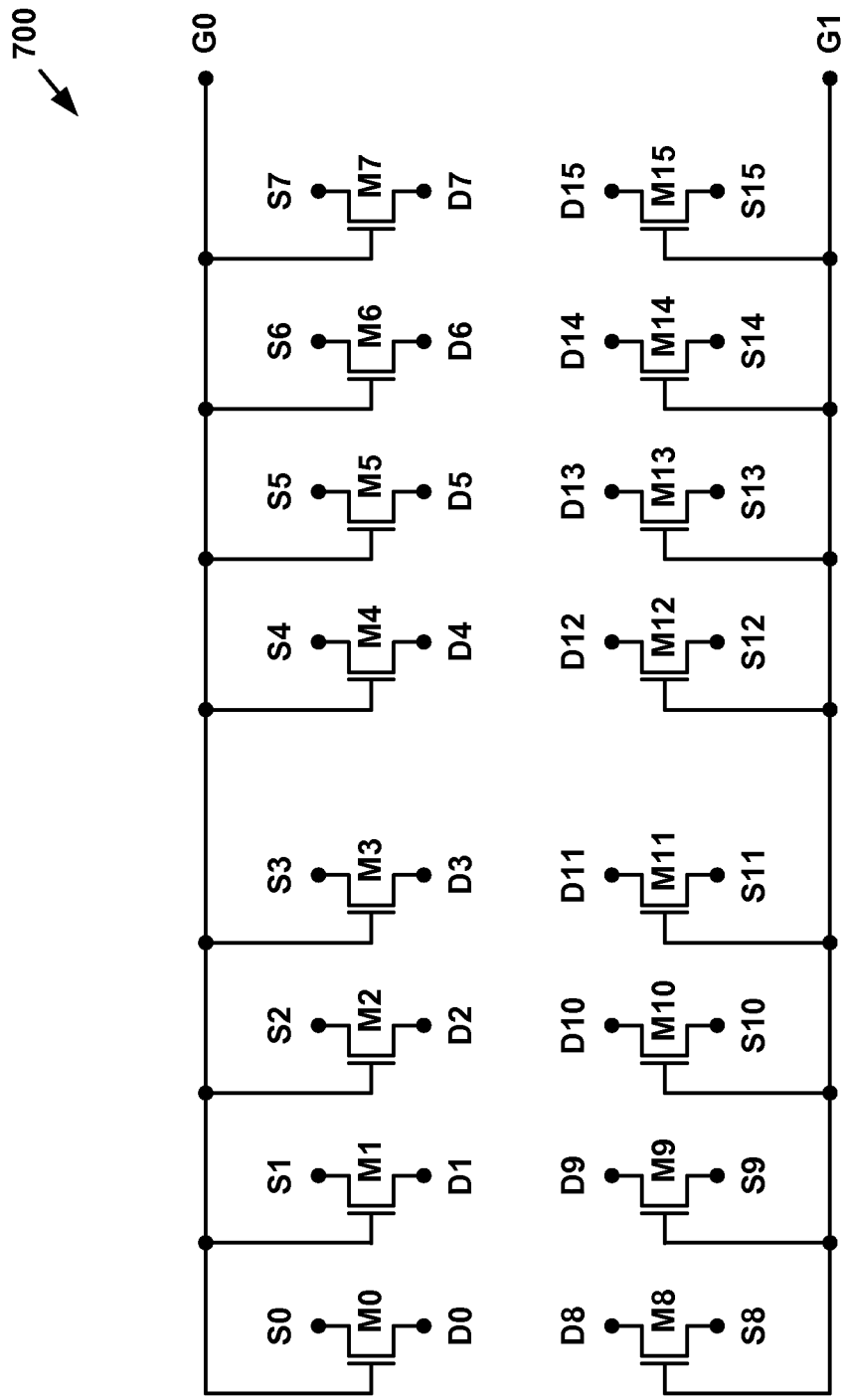
FIG. 7B depicts an equivalent circuit of the array of FIG. 7A.

FIGS. 7A-7B depict an embodiment of an array 700 of bit line select transistors M0, M1, . . . , M15, with FIG. 7A depicting a layout view and FIG. 7B depicting an equivalent circuit. Each of bit line select transistors M0, M1, . . . , M15 has a corresponding first terminal first terminal D0, D1, . . . , D15, respectively (e.g., a drain terminal), a second terminals (e.g., a gate terminal) coupled to a first gate conductor G0 (transistors M0, . . . , M7) and a second gate conductor G1 (transistors M8, . . . , M15), and a third terminal S0, S1, . . . , S15, respectively (e.g., a source terminal). In an embodiment, first and second gate conductors G0 and G1 are polysilicon. Each of bit line select transistors M0, M1, . . . , M15 also has an active area AA0, AA1, . . . , AA15, respectively. Persons of ordinary skill in the art will understand that first terminals D0, D1, . . . , D15 alternatively may be source terminals and third terminals S0, S1, . . . , S15 alternatively may be drain terminals. Persons of ordinary skill in the art also will understand that arrays of bit line select transistor may include more or fewer than 16 transistors.

In an embodiment, first terminals D0, D1, . . . , D15 are coupled to corresponding bit lines (not shown) and third terminals S0, S1, . . . , S15 are coupled to corresponding sense blocks (not shown). Because bit lines float to a higher voltage (e.g., Veramax) than voltages in sense blocks during erase operations, first terminals D0, D1, . . . , D15 also are referred to herein as high voltage (HV) terminals, and third terminals S0, S1, . . . , S15 also are referred to herein as low voltage (LV) terminals.

Array 700 includes a first edge region 702, a second edge region 704 and a shunt region 706. First edge region 702 is a region at a first (e.g., left) edge of array 700, and second edge region 704 is a region at a second (e.g., right) edge of array 700. Array 700 includes edge bit line select transistors M0 and M8 adjacent first edge region 702, and edge bit line select transistors M7 and M15 adjacent second edge region 704

Array 700 also includes a shunt region 706. A shunt region is a break in the transistor array that occurs after a predetermined number Nshunt of transistors. In the example array 700, shunt region 706 occurs after Nshunt=4 transistors. Persons of ordinary skill in the art will understand that other Nshunt values may be used.

Array 700 includes shunt bit line select transistors M3, M4, M11 and M12 which are adjacent shunt region 706. A separation D1 between two adjacent shunt bit line select transistors (e.g., M3 and M4) in a direction perpendicular to a long axis of the active areas is greater than a separation D2 between all other pairs of adjacent bit line select transistors (e.g., M0 and M1, M6 and M7) in a direction perpendicular to a long axis of the active areas.

As used herein, an "internal bit line select transistor" is a bit line select transistor in an array of bit line select transistors that is neither an edge transistor or a shunt transistor. Thus, array 700, includes edge bit line select transistors M0, M8, M7 and M15, shunt bit line select transistors M3, M11, M4 and M12, and internal bit line select transistors M1, M2, M5, M6, M9, M10, M13 and M14.

It has been observed that in an array of bit line select transistors, such as array 700, the junction breakdown voltage of each transistor in the array is affected by the voltage Vnei of terminals of adjacent transistors, and that junction breakdown voltage increases with increasing Vnei. During an erase operation, all bit lines float to Vera max. Accordingly, all internal bit line select transistors have high Vnei and thus have a corresponding high junction breakdown voltage. Edge and shunt bit line select transistors, in contrast do not have an increased high junction breakdown voltage.

Figure 8:
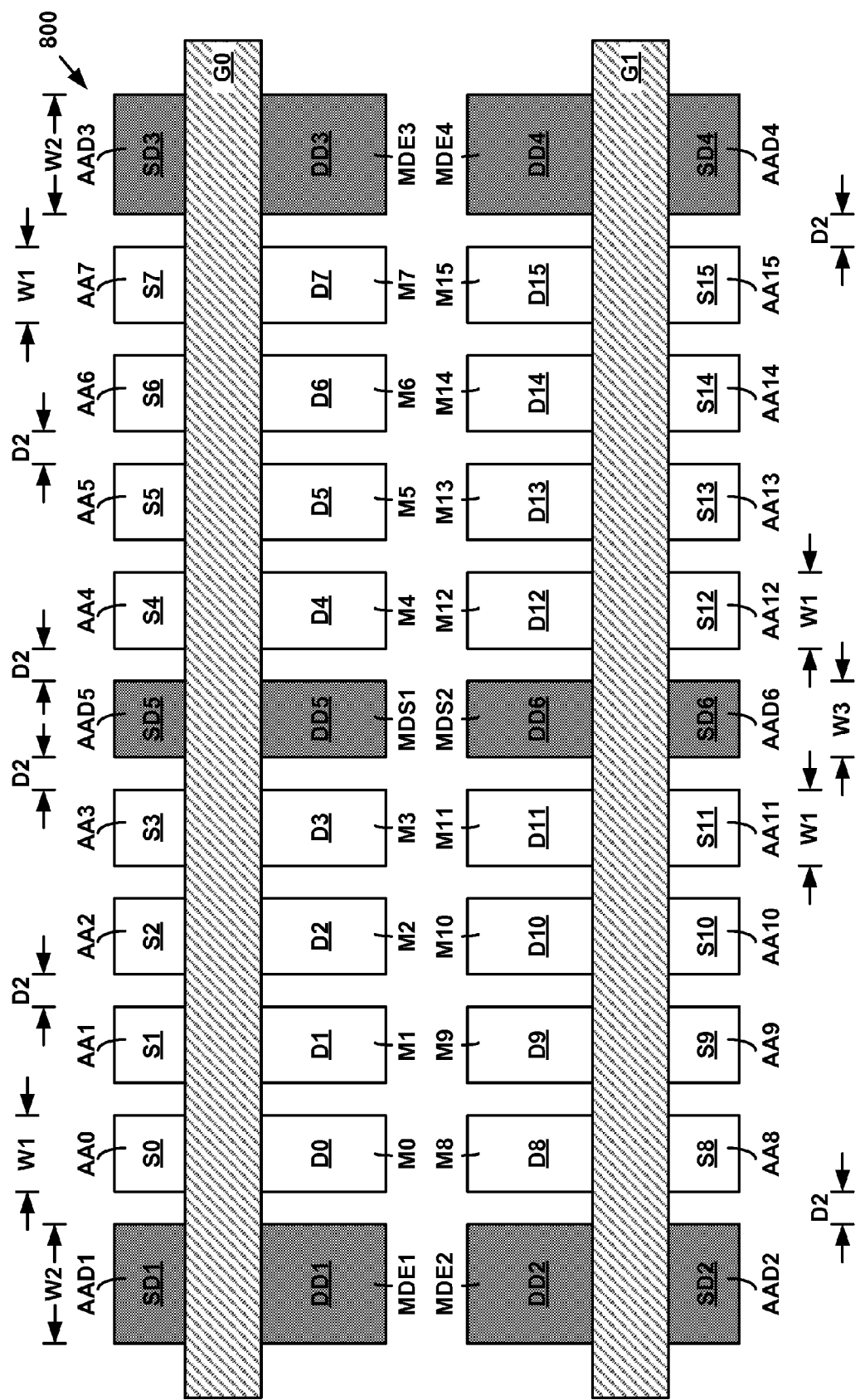
FIG. 8 depicts an embodiment of an array of bit line select transistors including dummy transistors.

FIG. 8 depicts an embodiment of a layout view of an array 800 of bit line select transistors M0, M1, . . . , M15, including edge transistors M0, M7, M8 and M15, and shunt transistors M3, M4, M11 and M12. Array 800 also includes dummy bit line select transistors MDE1, MDE2, MDE3, MDE4, MDS1 and MDS2. Dummy bit line select transistors MDE1, MDE2, MDE3, MDE4 are adjacent edge bit line select transistors M0, M8, M7 and M15, respectively. Dummy bit line select transistor MDS1 is adjacent shunt bit line select transistors M3 and M4, and dummy bit line select transistor MDS2 is adjacent shunt bit line select transistors M11 and M12.

In particular, MDE1 is a first dummy bit line select transistor adjacent edge bit line select transistor M0, and MDS1 is a second dummy bit line select transistor adjacent shunt bit line select transistor M3 and shunt bit line select transistor M4.

Each of dummy bit line select transistors MDE1, MDE2, MDE3, MDE4, MDS1 and MDS2 has a corresponding first terminal (e.g., a drain terminal), a second (e.g., a gate terminal), and a third terminal (e.g., a source terminal). The first terminal of each of dummy bit line select transistors MDE1, MDE2, MDE3, MDE4, MDS1 and MDS2 is coupled to a corresponding dummy bit line (not shown) that is floating (i.e., not connected to any other terminal). The second terminal of dummy bit line select transistors MDE1, MDS1 and MDE3 is coupled to first gate conductor G0, and the second terminal of dummy bit line select transistors MDE2, MDS2 and MDE4 is coupled to second gate conductor G1. The third terminal of each of dummy bit line select transistors MDE1, MDE2, MDE3, MDE4, MDS1 and MDS2 is floating (i.e., not connected to any other terminal).

Each of bit line select transistors M0, M1, . . . , M15 has a first width W1, each of dummy bit line select transistors MDE1, MDE2, MDE3, and MDE4 has a second width W2, and each of dummy bit line select transistors MDS1 and MDS2 has a third width. In an embodiment, second width W2 is greater than first width W1. In particular, because dummy bit line select transistors MDE1, MDE2, MDE3, and MDE4 are adjacent edges of array 800, the second width W2 is selected so that the junction breakdown voltage of dummy bit line select transistors MDE1, MDE2, MDE3, and MDE4 is at least Veramax (e.g., 24 V). In an embodiment, third width W3 is substantially equal to first width W1.

In an embodiment, first width W1 is between about 4000 angstroms and about 800 angstroms, second width W2 is between about 10000 angstroms and about 30000 angstroms, and third width W3 is between about 4000 angstroms and about 10000 angstroms. Other values for first width W1, second width W2 and third width W3 may be used.

Without wanting to be bound by any particular theory, it is believed that because dummy bit line select transistors MDE1, MDE2, MDE3, MDE4, MDS1 and MDS2 each have a first terminal coupled to a corresponding dummy bit line (not shown) that is floating, the dummy bit lines will float to Veramax during an erase operation, and hence the first terminal of each of dummy bit line select transistors MDE1, MDE2, MDE3, MDE4, MDS1 and MDS2 likewise will be at Veramax during an erase operation.

Because dummy bit line select transistors MDE1, MDE2, MDE3, and MDE4 are adjacent edge bit line select transistors M0, M8, M7 and M15, respectively, it is believed that edge bit line select transistors M0, M8, M7 and M15 will have a high Vnei (e.g., Veramax) and thus have a corresponding high junction breakdown voltage.

Because dummy bit line select transistor MDS1 is adjacent shunt bit line select transistors M3 and M4, and dummy bit line select transistor MDS2 is adjacent shunt bit line select transistors M11 and M12, it is believed that shunt bit line select transistors M3, M4, M11 and M12 will have a high Vnei (e.g., Veramax) and thus have a corresponding high junction breakdown voltage.

Figure 9:
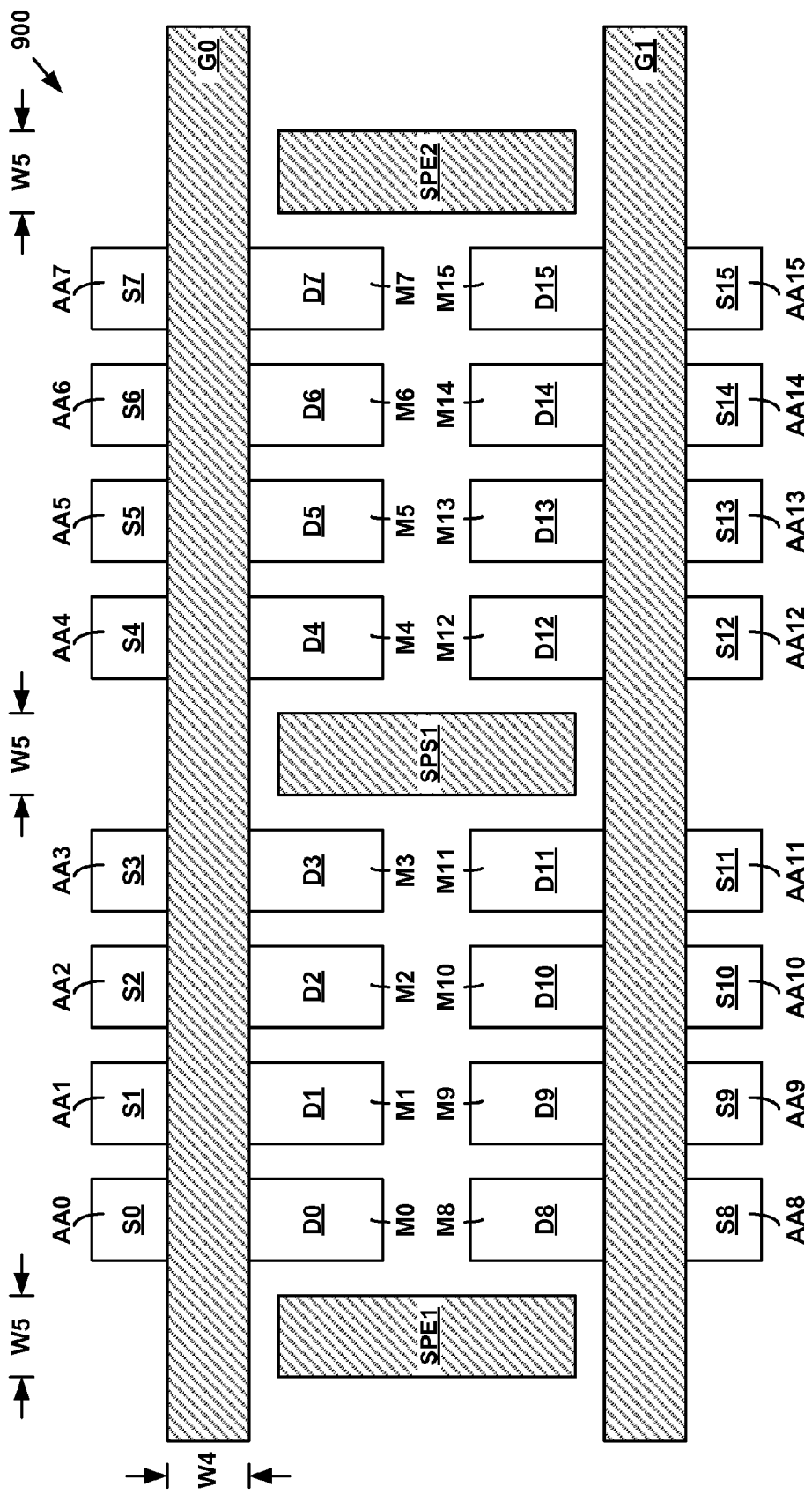
FIG. 9 depicts an embodiment of an array of bit line select transistors including polysilicon shields.

FIG. 9 depicts an embodiment of a layout view of an array 900 of bit line select transistors M0, M1, . . . , M15, including edge transistors M0, M7, M8 and M15, and shunt transistors M3, M4, M11 and M12. Array 900 also includes polysilicon shields SPE1, SPE2 and SPS1. Polysilicon shield SPE1 is adjacent edge bit line select transistors M0 and M8, and polysilicon shield SPE2 is adjacent edge bit line select transistors M7 and M15. Polysilicon shield SPS1 is adjacent shunt bit line select transistors M3, M4, M11, and M12. Each of polysilicon shields SPE1, SPE2 and SPS1 are connected to a corresponding dummy bit line that is coupled to Verase during an erase operation.

In particular, SPE1 is a first polysilicon shield adjacent edge bit line select transistors M0 and M8, and SPS1 is a second polysilicon shield adjacent shunt bit line select transistor M3 and shunt bit line select transistor M4.

First gate conductor G0 has a long axis, and each of polysilicon shields SPE1, SPE2 and SPS1 has a long axis that is substantially perpendicular to the long axis of first gate conductor G0. Second gate conductor G1 has a long axis substantially parallel to the long axis of first gate conductor G0.

First gate conductor G0 has a fourth width W4 and each of polysilicon shields SPE1, SPE2 and SPS1 has a fifth width W5. In an embodiment, fourth width W4 is between about 8000 angstroms and about 15000 angstroms, and fifth width W5 is between about 2000 angstroms and about 10000 angstroms. Other values for fourth width W4 and fifth width W5 may be used.

Without wanting to be bound by any particular theory, it is believed that because polysilicon shields SPE1, SPE2 and SPS1 are connected to corresponding dummy bit lines that are coupled to Verase, polysilicon shields SPE1, SPE2 and SPS1 will be raised to Verase during an erase operation, and will increase the junction breakdown voltage of each of edge bit line select transistors M0, M7, M8 and M15, and shunt bit line select transistors M3, M4, M11 and M12.

Figure 10:
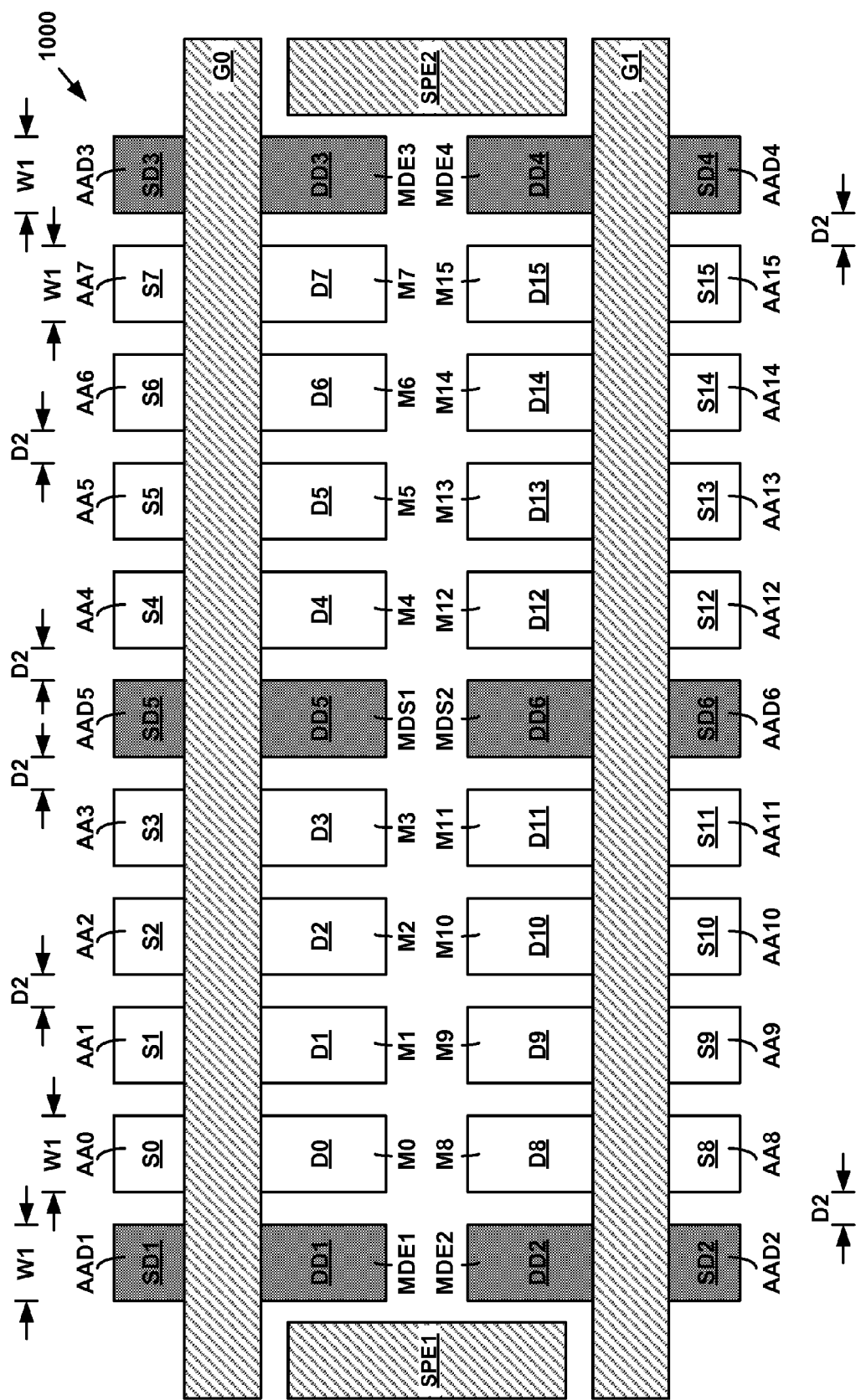
FIG. 10 depicts an embodiment of an array of bit line select transistors including dummy transistors and polysilicon shields.

FIG. 10 depicts an embodiment of a layout view of an array 1000 of bit line select transistors M0, M1, . . . , M15, including edge transistors M0, M7, M8 and M15, and shunt transistors M3, M4, M11 and M12. Array 1000 also includes dummy bit line select transistors MDE1, MDE2, MDE3, MDE4, MDS1 and MDS2. Dummy bit line select transistors MDE1, MDE2, MDE3, MDE4 are adjacent edge bit line select transistors M0, M8, M7 and M15, respectively. Dummy bit line select transistor MDS1 is adjacent shunt bit line select transistors M3 and M4, and dummy bit line select transistor MDS2 is adjacent shunt bit line select transistors M11 and M12. Array 100 also includes polysilicon shields SPE1 and SPE2. Polysilicon shield SPE1 is adjacent edge bit line select transistors M0 and M8, and polysilicon shield SPE2 is adjacent edge bit line select transistors M7 and M15.

Each of bit line select transistors M0, M1, ..., M15 has a first width W1, and each of dummy bit line select transistors MDE1, MDE2, MDE3, MDE4, MDS1 and MDS2 has a width substantially equal to first width.

Without wanting to be bound by any particular theory, it is believed that because dummy bit line select transistors MDE1, MDE2, MDE3, MDE4, MDS1 and MDS2 each have a first terminal coupled to a corresponding dummy bit line (not shown) that is floating, the dummy bit lines will float to Veramax during an erase operation, and hence the first terminal of each of dummy bit line select transistors MDE1, MDE2, MDE3, MDE4, MDS1 and MDS2 likewise will be at Veramax during an erase operation.

Because dummy bit line select transistors MDE1, MDE2, MDE3, and MDE4 are adjacent edge bit line select transistors M0, M8, M7 and M15, respectively, it is believed that edge bit line select transistors M0, M8, M7 and M15 will have a high Vnei (e.g., Veramax) and thus have a corresponding high junction breakdown voltage.

Because dummy bit line select transistor MDS1 is adjacent shunt bit line select transistors M3 and M4, and dummy bit line select transistor MDS2 is adjacent shunt bit line select transistors M11 and M12, it is believed that shunt bit line select transistors M3, M4, M11 and M12 will have a high Vnei (e.g., Veramax) and thus have a corresponding high junction breakdown voltage.

Without wanting to be bound by any particular theory, it is believed that because polysilicon shields SPE1 and SPE2 are connected to corresponding dummy bit lines that are coupled to Verase, polysilicon shields SPE1 and SPE2 will be raised to Verase during an erase operation, and will increase the junction breakdown voltage of each of dummy bit line select transistors MDE1, MDE2, MDE3 and MDE4.

One embodiment of the disclosed technology includes a non-volatile storage system. The non-volatile storage system includes a memory array that includes a plurality of bit lines and a plurality of sense blocks, a plurality of bit line select transistors arranged in a bit line select transistor array, each bit line select transistor coupled between a corresponding one of the bit lines and a corresponding one of the sense blocks, the bit line select transistor array including an edge bit line select transistor adjacent an edge of the bit line select transistor array, and a first dummy bit line select transistor adjacent the edge bit line select transistor.

Another embodiment of the disclosed technology includes a non-volatile storage system. The non-volatile storage system includes a memory array that includes a plurality of bit lines and a plurality of sense blocks, a plurality of bit line select transistors arranged in a bit line select transistor array, each bit line select transistor coupled between a corresponding one of the bit lines and a corresponding one of the sense blocks, the bit line select transistor array comprising an edge bit line select transistor adjacent an edge of the bit line select transistor array, the edge bit line select transistor comprising a polysilicon gate, and a first polysilicon shield adjacent the polysilicon gate.

Still another embodiment of the disclosed technology includes a non-volatile storage system. The non-volatile storage system includes a memory array that includes a plurality of bit lines and a plurality of sense blocks, a plurality of bit line select transistors arranged in a bit line select transistor array, each bit line select transistor coupled between a corresponding one of the bit lines and a corresponding one of the sense blocks, the bit line select transistor array comprising an edge bit line select transistor adjacent an edge of the bit line select transistor array, the edge bit line select transistor comprising a polysilicon gate, a first dummy bit line select transistor adjacent the edge bit line select transistor, and a first polysilicon shield adjacent the polysilicon gate.

Another embodiment of the disclosed technology includes a method for forming a non-volatile storage system. The method includes providing a memory array that includes a plurality of bit lines and a plurality of sense blocks, providing a plurality of bit line select transistors arranged in a bit line select transistor array, the bit line select transistor array comprising an edge bit line select transistor adjacent an edge of the bit line select transistor array, coupling each bit line select transistor between a corresponding one of the bit lines and a corresponding one of the sense blocks, and disposing a first dummy bit line select transistor adjacent the edge bit line select transistor.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A non-volatile storage system comprising:
   a memory array that includes a plurality of bit lines and a plurality of sense blocks;
   a plurality of bit line select transistors arranged in a bit line select transistor array, each bit line select transistor coupled between a corresponding one of the bit lines and a corresponding one of the sense blocks, the bit line select transistor array comprising an edge bit line select transistor adjacent an edge of the bit line select transistor array; and
   a first dummy bit line select transistor adjacent the edge bit line select transistor,
   wherein:
      the edge bit line select transistor comprises a first width;
      the first dummy bit line select transistor comprises a second width greater than the first width.

2. The non-volatile storage system of claim 1, wherein:
the memory array comprises a non-volatile memory that is monolithically formed in one or more physical levels of memory cells having active areas disposed above a silicon substrate; and
the non-volatile storage system includes circuitry associated with the operation of the memory array.

3. The non-volatile storage system of claim 1, wherein the memory array comprises a three-dimensional memory array.

4. A non-volatile storage system comprising:
a memory array that includes a plurality of bit lines and a plurality of sense blocks;
a plurality of bit line select transistors arranged in a bit line select transistor array, each bit line select transistor coupled between a corresponding one of the bit lines and a corresponding one of the sense blocks, the bit line select transistor array comprising:
an edge bit line select transistor adjacent an edge of the bit line select transistor array;
a first dummy bit line select transistor adjacent the edge bit line select transistor;
a shunt bit line select transistor adjacent a shunt region of the bit line select transistor array; and
a second dummy bit line select transistor adjacent the shunt bit line select transistor.

5. The non-volatile storage system of claim 4, wherein:
the shunt bit line select transistor comprises a first width; and
the second dummy bit line select transistor comprises a third width substantially equal to the first width.

6. A non-volatile storage system comprising:
a memory array that includes a plurality of bit lines and a plurality of sense blocks;
a plurality of bit line select transistors arranged in a bit line select transistor array, each bit line select transistor coupled between a corresponding one of the bit lines and a corresponding one of the sense blocks, the bit line select transistor array comprising an edge bit line select transistor adjacent an edge of the bit line select transistor array, the edge bit line select transistor comprising a polysilicon gate; and
a first polysilicon shield adjacent the polysilicon gate.

7. The non-volatile storage system of claim 6, wherein:
the polysilicon gate comprises a long axis;
the first polysilicon shield comprises a long axis that is substantially perpendicular to the long axis of the polysilicon gate.

8. The non-volatile storage system of claim 6, wherein the bit line select transistor array further comprises:
a shunt bit line select transistor adjacent a shunt region of the bit line select transistor array, the shunt bit line select transistor comprising the polysilicon gate; and
a second polysilicon shield adjacent the polysilicon gate.

9. The non-volatile storage system of claim 6, wherein:
the memory array comprises a non-volatile memory that is monolithically formed in one or more physical levels of memory cells having active areas disposed above a silicon substrate; and
the non-volatile storage system includes circuitry associated with the operation of the memory array.

10. The non-volatile storage system of claim 6, wherein the memory array comprises a three-dimensional memory array.

11. A non-volatile storage system comprising:
a memory array that includes a plurality of bit lines and a plurality of sense blocks;
a plurality of bit line select transistors arranged in a bit line select transistor array, each bit line select transistor coupled between a corresponding one of the bit lines and a corresponding one of the sense blocks, the bit line select transistor array comprising an edge bit line select transistor adjacent an edge of the bit line select transistor array, the edge bit line select transistor comprising a polysilicon gate;
a first dummy bit line select transistor adjacent the edge bit line select transistor; and
a first polysilicon shield adjacent the polysilicon gate.

12. The non-volatile storage system of claim 11, wherein:
the edge bit line select transistor comprises a first width; and
the first dummy bit line select transistor comprises a second width substantially equal to the first width.

13. The non-volatile storage system of claim 11, wherein:
the polysilicon gate comprises a long axis;
the first polysilicon shield comprises a long axis that is substantially perpendicular to the long axis of the polysilicon gate.

14. The non-volatile storage system of claim 11, wherein the bit line select transistor array further comprises:
a shunt bit line select transistor adjacent a shunt region of the bit line select transistor array; and
a second dummy bit line select transistor adjacent the shunt bit line select transistor.

15. The non-volatile storage system of claim 14, wherein:
the shunt bit line select transistor comprises a first width; and
the second dummy bit line select transistor comprises a third width substantially equal to the first width.

16. The non-volatile storage system of claim 11, wherein:
the memory array comprises a non-volatile memory that is monolithically formed in one or more physical levels of memory cells having active areas disposed above a silicon substrate; and
the non-volatile storage system includes circuitry associated with the operation of the memory array.

17. The non-volatile storage system of claim 11, wherein the memory array comprises a three-dimensional memory array.

18. A method for forming a non-volatile storage system, the method comprising:
providing a memory array that includes a plurality of bit lines and a plurality of sense blocks;
providing a plurality of bit line select transistors arranged in a bit line select transistor array, the bit line select transistor array comprising an edge bit line select transistor adjacent an edge of the bit line select transistor array;
coupling each bit line select transistor between a corresponding one of the bit lines and a corresponding one of the sense blocks; and
disposing a first dummy bit line select transistor adjacent the edge bit line select transistor,
wherein:
the edge bit line select transistor comprises a first width; and
the first dummy bit line select transistor comprises a second width greater than the first width.

19. The method of claim 18, wherein:
the memory array comprises a non-volatile memory that is monolithically formed in one or more physical levels of memory cells having active areas disposed above a silicon substrate; and the non-volatile storage system includes circuitry associated with the operation of the memory array.

20. The method of claim 18, wherein the memory array comprises a three-dimensional memory array.

21. A method for forming a non-volatile storage system, the method comprising:
providing a memory array that includes a plurality of bit lines and a plurality of sense blocks;
providing a plurality of bit line select transistors arranged in a bit line select transistor array, the bit line select transistor array comprising an edge bit line select transistor adjacent an edge of the bit line select transistor array;
coupling each bit line select transistor between a corresponding one of the bit lines and a corresponding one of the sense blocks;
disposing a first dummy bit line select transistor adjacent the edge bit line select transistor;
forming a shunt region in the bit line select transistor array;
providing a shunt bit line select transistor adjacent the shunt region; and
providing a second dummy bit line select transistor adjacent the shunt bit line select transistor.

22. The method of claim 21, wherein:
the shunt bit line select transistor comprises a first width; and
the second dummy bit line select transistor comprises a third width substantially equal to the first width.

* * * * *